(12) United States Patent
Liu et al.

(10) Patent No.: US 7,831,856 B1
(45) Date of Patent: Nov. 9, 2010

(54) DETECTION OF TIMING ERRORS IN PROGRAMMABLE LOGIC DEVICES

(75) Inventors: Liren Liu, Sunnyvale, CA (US); Jianshe He, Cupertino, CA (US); Shangzhi Sun, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 350 days.

(21) Appl. No.: 12/061,885

(22) Filed: Apr. 3, 2008

(51) Int. Cl.
*G06F 11/00* (2006.01)
(52) U.S. Cl. .......................................... 714/2; 714/700
(58) Field of Classification Search ................. 714/700, 714/731, 744, 2
See application file for complete search history.

(56) References Cited

U.S. PATENT DOCUMENTS

| | | | |
|---|---|---|---|
| 6,834,255 B2 | 12/2004 | Abrosimov et al. | |
| 7,107,477 B1 * | 9/2006 | Singh et al. ................. | 713/503 |
| 7,165,185 B2 | 1/2007 | Li et al. | |
| 7,178,048 B2 | 2/2007 | Smith et al. | |
| 7,268,602 B2 | 9/2007 | Nguyen et al. | |
| 7,274,605 B2 | 9/2007 | Stubbs | |
| 2009/0019304 A1 * | 1/2009 | Wong ........................ | 713/503 |

* cited by examiner

*Primary Examiner*—Michael C Maskulinski
(74) *Attorney, Agent, or Firm*—Haynes and Boone, LLP

(57) ABSTRACT

In one example, a method of detecting timing errors in a configuration of a programmable logic device (PLD) includes performing a timing analysis on the PLD configuration. The PLD configuration is adapted to configure the PLD to perform a data transfer between a first clock domain synchronized by a first clock signal received by a double data rate (DDR) block of the PLD configuration and a second clock domain synchronized by a second clock signal received by the DDR block. The method includes calculating a slack value associated with the data transfer using a first delay associated with the first clock signal, a second delay associated with the second clock signal, and a time constraint associated with the data transfer. The first delay and the second delay are provided by the timing analysis. The method includes determining whether the PLD configuration satisfies the time constraint based on the slack value.

18 Claims, 8 Drawing Sheets

```
long ddr_adjust_setup_slack (long&slack, long adj_size, long setup_time)
{
    long slack_org=slack;                    }- 910
    while (slack<-setup_time)                ]
        slack += adj_size;                   }- 920
    thresh = adj_size-setup_time;            }- 930
    if (thresh>0)
    {
        while (slack>=thresh)                }- 940
            slack -= adj_size;
    }
    return (slack-slack_org);                }- 950
}
```

DETECTION OF TIMING ERRORS IN PROGRAMMABLE LOGIC DEVICES

TECHNICAL FIELD

The present invention relates generally to programmable logic devices and, more particularly, to the synchronization of clock signals of programmable logic devices.

BACKGROUND

Clock signals are typically used to synchronize data signals in electronic devices. In certain applications, multiple clock signals may be provided in a single device. As these clock signals propagate through the device, they pass through clock signal paths of different lengths and complexity depending on the particular routing of the clock signal paths. As a result, different clock signals may experience different delays caused by these clock signal paths and thus may exhibit clock skew relative to each other.

In order to minimize the effects of such clock skew, additional delays may be introduced into the clock signal paths of individual clock signals to align the clock edges of different clock signals such that the clock edges arrive at a given destination at approximately the same time. For example, in conventional application-specific integrated circuits (ASICs), the routing of clock signals is typically hardwired into the design of integrated circuits. In such applications, clock skew can typically be predicted and corrected to satisfactory accuracy through the introduction of predictable delays into the clock signal paths for hardwired clock signal paths.

However, for programmable logic devices (PLDs) such as field programmable gate arrays (FPGAs) or complex programmable logic devices (CPLDs), the routing of clock signals is largely dependant on the user-configurable designs implemented in the PLDs. As such, clock signal delays and the resulting clock skew can vary widely depending on the particular configuration of a PLD.

These problems are further complicated in implementations where different portions of a PLD are synchronized by various clock signals corresponding to different clock domains. In this regard, when data signals are passed between different clock domains, data signals synchronized by a first clock signal of a first frequency may be provided to flip flops synchronized by a second clock signal of a second frequency. In this case, it is important that the clock edges of the different clock signals be coordinated in order to meet the hold time and setup time constraints associated with the flip flops.

Nevertheless, conventional techniques used to minimize clock skew fail to satisfy such hold time and setup time constraints and thus may cause clock-to-clock data transfers to fail. Accordingly, there is a need for an improved approach for reducing the effects of clock skew between multiple clocks to permit successful data transfers between different clock domains of a PLD.

SUMMARY

In accordance with one embodiment of the present invention, a method of detecting timing errors in a configuration of a programmable logic device (PLD) includes performing a timing analysis on the PLD configuration, wherein the PLD configuration is adapted to configure the PLD to perform a data transfer between a first clock domain synchronized by a first clock signal received by a double data rate (DDR) block of the PLD configuration and a second clock domain synchronized by a second clock signal received by the DDR block; calculating a slack value associated with the data transfer using a first delay associated with the first clock signal, a second delay associated with the second clock signal, and a time constraint associated with the data transfer, wherein the first delay and the second delay are provided by the timing analysis; and determining whether the PLD configuration satisfies the time constraint based on the slack value.

In accordance with another embodiment of the present invention, a system includes one or more processors; and one or more memories adapted to store a plurality of computer readable instructions which when executed by the one or more processors are adapted to cause the system to perform a method of detecting timing errors in a configuration of a programmable logic device (PLD), the method comprising: performing a timing analysis on the PLD configuration, wherein the PLD configuration is adapted to configure the PLD to perform a data transfer between a first clock domain synchronized by a first clock signal received by a double data rate (DDR) block of the PLD configuration and a second clock domain synchronized by a second clock signal received by the DDR block, calculating a slack value associated with the data transfer using a first delay associated with the first clock signal, a second delay associated with the second clock signal, and a time constraint associated with the data transfer, wherein the first delay and the second delay are provided by the timing analysis, and determining whether the PLD configuration satisfies the time constraint based on the slack value.

In accordance with another embodiment of the present invention, a system for detecting timing errors in a configuration of a programmable logic device (PLD) includes means for performing a timing analysis on the PLD configuration, wherein the PLD configuration is adapted to configure the PLD to perform a data transfer between a first clock domain synchronized by a first clock signal received by a double data rate (DDR) block of the PLD configuration and a second clock domain synchronized by a second clock signal received by the DDR block; means for calculating a slack value associated with the data transfer using a first delay associated with the first clock signal, a second delay associated with the second clock signal, and a time constraint associated with the data transfer, wherein the first delay and the second delay are provided by the timing analysis; and means for determining whether the PLD configuration satisfies the time constraint based on the slack value.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Various techniques further described herein may be used to determine timing errors associated with clock signals of a PLD using clock timing slack (e.g., differences between required arrival times and actual arrival times of clock signals). In one embodiment, timing constraints such as setup time constraints and hold time constraints may be used to determine the occurrence of setup time violations and hold time violations wherein clock signals are received outside of valid timing windows. Advantageously, such techniques may be used to facilitate data transfers across clock domains synchronized by clock signals operating at different frequencies in a manner better suited to optimize the timing of clock signals used by PLD configurations than prior clock skew compensation techniques.

Figure 1:
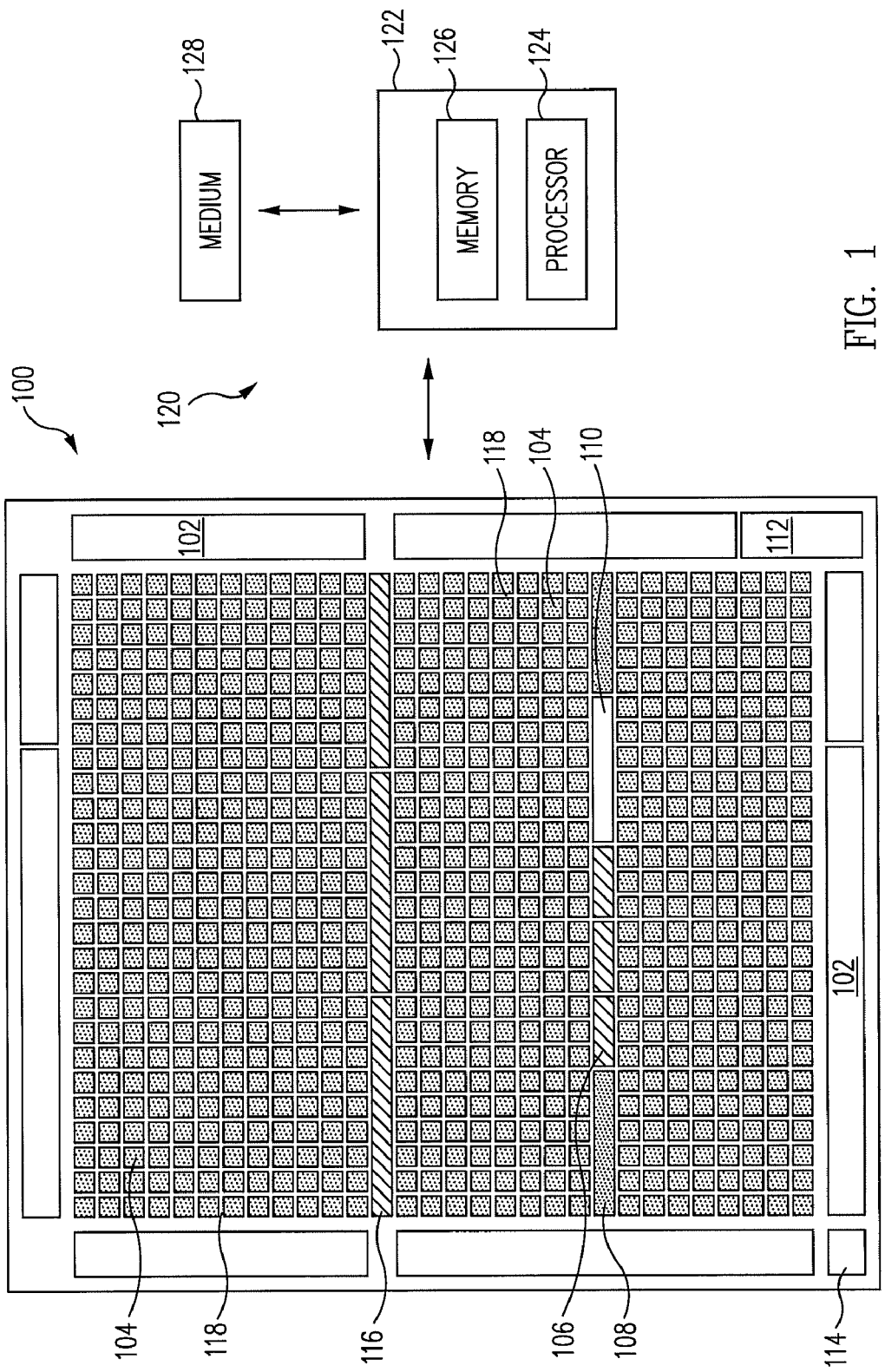
FIG. 1 illustrates a block diagram of a programmable logic device (PLD) and a system for use with the PLD in accordance with an embodiment of the invention.

FIG. 1 illustrates a block diagram of a programmable logic device (PLD) 100 and a system 120 for use with PLD 100 in accordance with an embodiment of the invention. PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., digital signal processing (DSP) blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, a serial peripheral interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the present invention as disclosed herein are not limited to programmable logic devices, such as PLD 100, and may be applied to various other types of programmable devices, as would be understood by one skilled in the art.

System 120 includes a computing device 122 and a computer readable medium 128. As shown, computing device 122 includes a processor 124 and a memory 126. Processor 124 may be configured with appropriate software (e.g., a computer program for execution by a computer) that is stored on computer readable medium 128 and/or in memory 126 to instruct processor 124 to perform one or more of the operations described herein.

For example, in one embodiment, means such as processor 124 configured with such software may be used for: performing a timing analysis on a configuration of PLD 100, wherein the PLD configuration is adapted to configure PLD 100 to perform a data transfer between a first clock domain synchronized by a first clock signal received by a double data rate (DDR) block of the PLD configuration and a second clock domain synchronized by a second clock signal received by the DDR block; calculating a slack value associated with the data transfer using a first delay associated with the first clock signal, a second delay associated with the second clock signal, and a time constraint associated with the data transfer, wherein the first delay and the second delay are provided by the timing analysis; and determining whether the PLD configuration satisfies the time constraint based on the slack value.

Processor 124 and memory 126 may be implemented in accordance with any appropriate components that may be used to provide computing system 120. Similarly, computer readable medium 128 may be implemented using any appropriate type of machine-readable medium used to store software. System 120 may be implemented to provide configuration data prepared by system 120 to PLD 100 through, for example, configuration port 112.

In various embodiments, such configuration data identifies the configuration of routing resources 118 to determine the placement and routing of data paths and clock paths through PLD 100. For example, interconnections between various components of PLD 100 may be specified by such configuration data.

Figure 2:
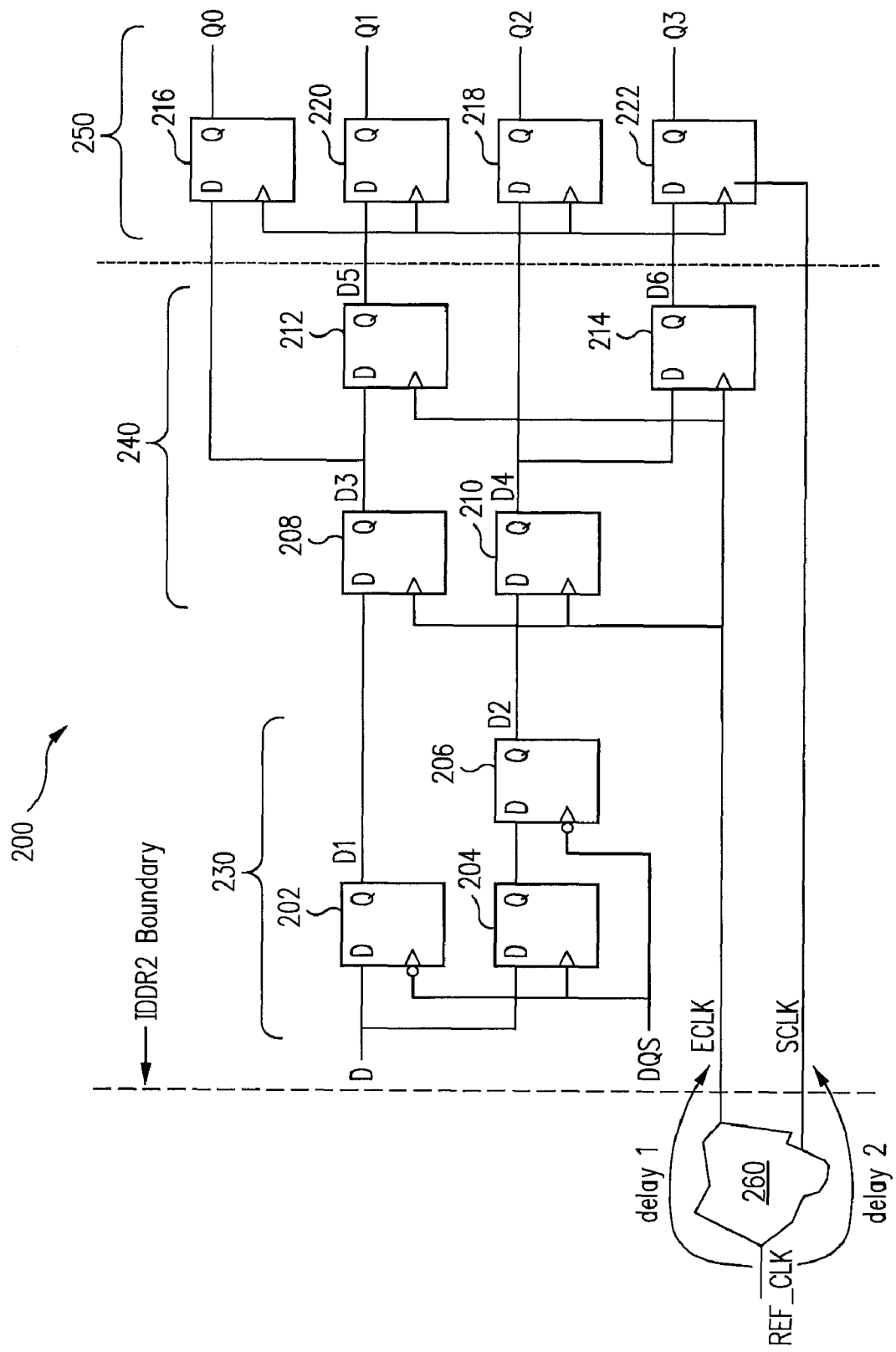
FIG. 2 illustrates an input double data rate (IDDR) block of a PLD in accordance with an embodiment of the invention.
Figure 3:
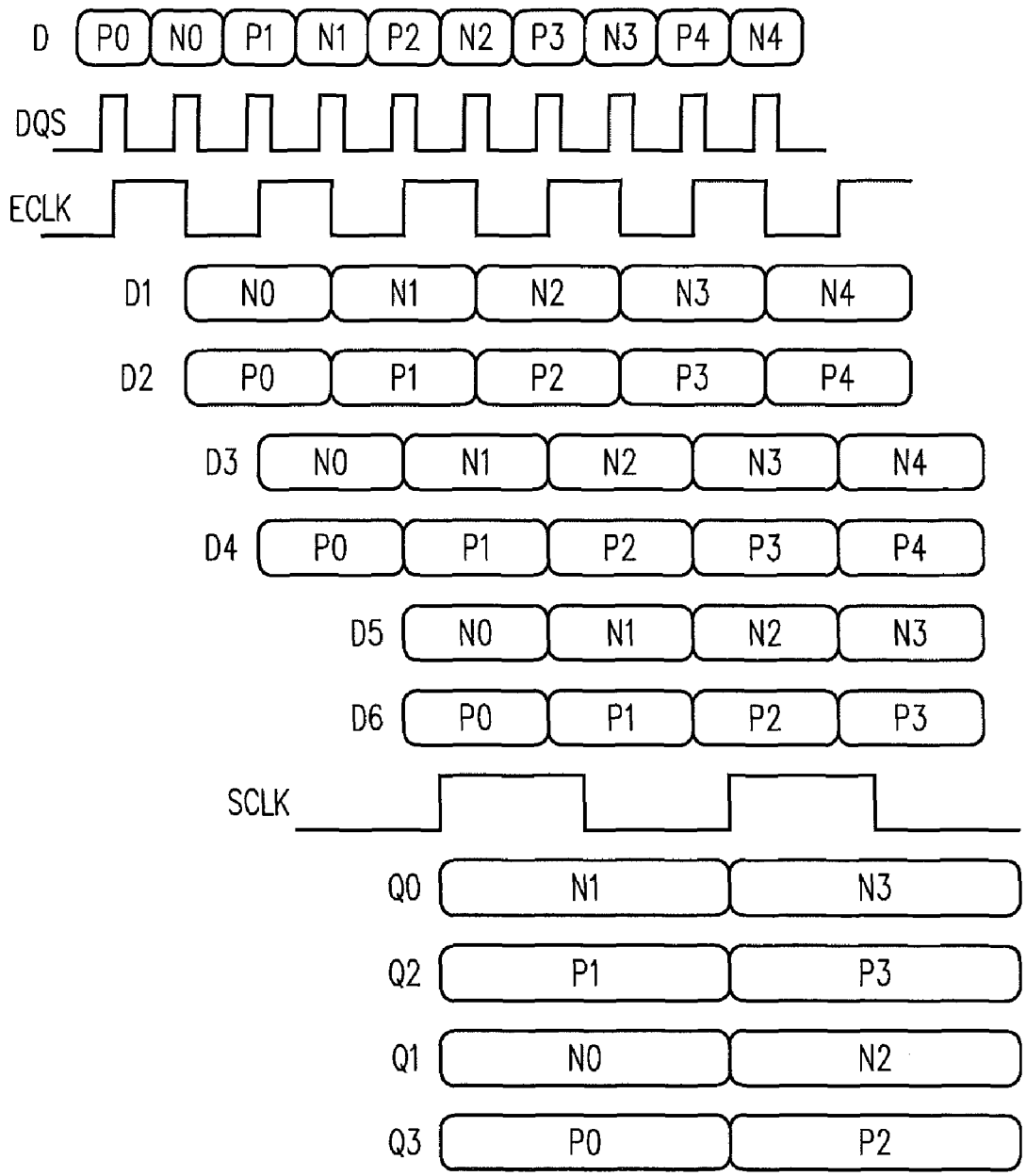
FIG. 3 illustrates a timing diagram of various signals of the IDDR block of FIG. 2 in accordance with an embodiment of the invention.

FIG. 2 illustrates an input double data rate (IDDR) block 200 of a PLD in accordance with an embodiment of the invention, and FIG. 3 illustrates a timing diagram 300 of various signals of IDDR block 200 in accordance with an embodiment of the invention. IDDR block 200 may be used to convert an input data signal D into a plurality of parallel output data signals Q0 to Q3, where serial data encoded in input data signal D is distributed over output data signals Q0 to Q3. As shown in FIG. 3, input data signal D operates at a frequency higher than output data signals Q0 to Q3.

In one embodiment, IDDR block 200 may be implemented as part of a DDR memory that supports data transfers on one or both edges (e.g., the rising and falling edges) of a clock cycle, effectively doubling the memory's data throughput over implementations using single edge data transfers. In this regard, IDDR block 200 may be implemented as part of memory 106 and/or configuration memory 114 in embodiments where such memories are implemented as DDR memories. In another embodiment, IDDR block 200 may be implemented as part of I/O blocks 102 of PLD 100.

As shown in FIG. 2, IDDR block 200 includes a plurality of flip-flops (FFs) 202 to 222. IDDR block 200 receives an input data signal D, receives clock signals DQS, ECLK, and SCLK, provides intermediate data signals D1 to D6, and provides output data signals Q0 to Q3.

Input data signal D is sampled by FFs 202, 204, and 206 under the control of clock signal DQS to provide intermediate data signals D1 and D2. Intermediate data signals D1 and D2 are sampled by FFs 208 and 210 under the control of clock signal ECLK to provide intermediate data signals D3 and D4. Intermediate data signals D3 and D4 are sampled by FFs 212 and 214 under the control of clock signal ECLK to provide intermediate data signals D5 and D6. Intermediate data signals D3, D4, D5, and D6 are sampled by FFs 216, 218, 220, and 220, respectively, under the control of clock signal SCLK to provide data output data signals Q0, Q1, Q2, and Q3, respectively.

In various embodiments, clock signals DQS, ECLK, and SCLK may operate at different frequencies. As a result, different portions of IDDR block 200 correspond to different clock domains denoted by clock domains 230, 240, and 250 in FIG. 2. For example, in one embodiment, clock signal DQS is implemented by a data strobe signal that operates at a frequency approximately equal to a frequency of clock signal ECLK which operates at a frequency approximately twice a frequency of clock signal SCLK.

As shown in FIG. 2, in one embodiment, clock signals ECLK and SCLK may originate from a single reference clock signal REF_CLK which is converted and passed by intermediate circuitry 260 (e.g., one or more appropriate phase-locked loop (PLL) circuits and routing paths) to provide clock signals ECLK and SCLK to IDDR block 200. As also shown in FIG. 2, when clock signals ECLK and SCLK arrive at IDDR block 200 after passing through intermediate circuitry 260, they exhibit delays of delay1 and delay2, respectively, relative to reference clock signal REF_CLK.

Data transfers performed by IDDR block 200 have an associated setup time constraint (referred to as ECLK2SCLK_SET) and an associated hold time constraint (referred to as ECLK2SCLK_HLD) which must be met to ensure that the various data signals provided to FFs 202 to 222 are properly sampled and successfully passed across clock domains 230, 240, and 250.

For example, as shown in FIG. 3, data transfers occur from clock domain 240 (synchronized by clock signal ECLK) to clock domain 250 (synchronized by clock signal SCLK), where clock signal SCLK lags clock signal ECLK.

In the embodiments described herein in relation to FIGS. 2-6, the timing of input data signal D and of clock signal DQS relative to clock signal ECLK is assumed to meet the setup and hold time constraints of IDDR block 200. However, in embodiments where such constraints are not met (for example, where clock signal ECLK is provided by routing resources 118 of PLD 100), the various techniques described herein in relation to clock signals ECLK and SCLK concerning the transfer of data signals from clock domain 240 to clock domain 250 can be similarly applied to the transfer of data signals from clock domain 230 to clock domain 240.

Figure 4:
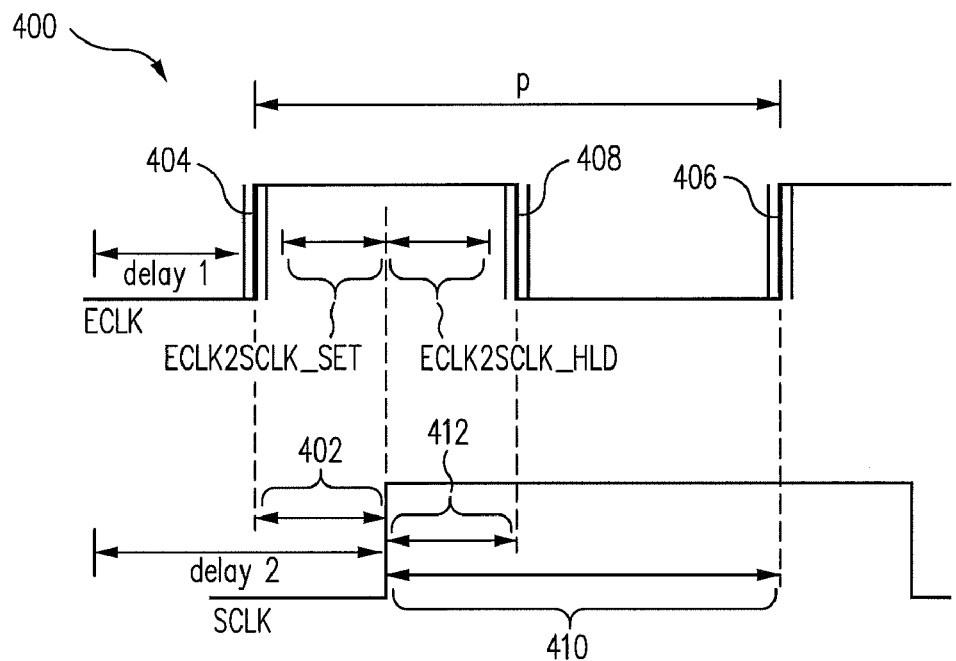
FIG. 4 illustrates a first timing diagram of two clock signals of the IDDR block of FIG. 2 in accordance with an embodiment of the invention.

FIG. 4 illustrates a timing diagram 400 of clock signals ECLK and SCLK of IDDR block 200 of FIG. 2 in accordance with an embodiment of the invention. In the embodiment shown in FIG. 4, the rising edge of clock signal SCLK lags behind the rising edge of clock signal ECLK by a time period 402 that is less than or equal to one half a period p of clock signal ECLK. Accordingly, FIG. 4 illustrates a case in which the following equation 1 is true:

$$0 \leq (\text{delay2} - \text{delay1}) \leq p/2 \quad \text{(equation 1)}$$

In this case, where the setup time constraint associated with a data transfer from clock domain 240 to clock domain 250 (e.g., from clock signal ECLK to clock signal SCLK) is denoted ECLK2SCLK_SET, the clock setup time slack S_setup can be calculated using the following equation 2:

$$S\_setup = \text{delay2} - \text{delay1} - ECLK2SCLK\_SET \quad \text{(equation 2)}$$

In equation 2 above, the setup time constraint ECLK2SCLK_SET will be met for where clock setup time slack S_setup is greater than or equal to zero (e.g., where time period 402 is greater than or equal to setup time constraint ECLK2SCLK_SET).

Continuing the example shown in FIG. 4, where the hold time constraint associated with a data transfer from clock domain 240 to clock domain 250 (e.g., from clock signal ECLK to clock signal SCLK) is denoted ECLK2SCLK_HLD, the clock hold time slack S_hold can be calculated using the following equation 3, where n=1 if clock signal ECLK clocks data on only one clock edge (e.g., on rising clock edges 404 and 406), where n=2 if clock signal ECLK clocks data on rising and falling clock edges (e.g., on rising clock edges 404 and 406, and also on falling clock edge 408), and where clock signals ECLK and SCLK each exhibit 50% duty cycles:

$$S\_hold = (\text{delay1} + p/n) - \text{delay2} - ECLK2SCLK\_HLD \quad \text{(equation 3)}$$

In equation 3 above, the hold time constraint ECLK2SCLK_HLD will be met for where clock hold time slack S_hold is greater than or equal to zero (e.g., where a time period 410 is greater than or equal to hold time constraint ECLK2SCLK_HLD if n=1, and where a time period 412 is greater than or equal to hold time constraint ECLK2SCLK_HLD if n=2).

Figure 5:
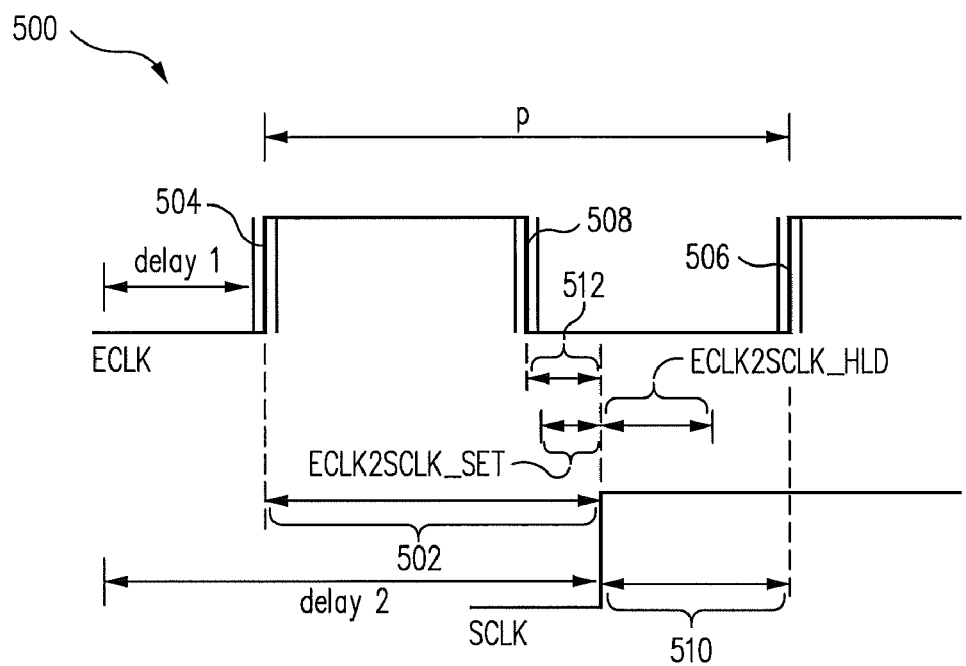
FIG. 5 illustrates a second timing diagram of two clock signals of the IDDR block of FIG. 2 in accordance with an embodiment of the invention.

FIG. 5 illustrates another timing diagram 500 of clock signals ECLK and SCLK of IDDR block 200 of FIG. 2 in accordance with an embodiment of the invention. In the embodiment shown in FIG. 5, the rising edge of clock signal SCLK lags behind the rising edge of clock signal ECLK by a time period 502 that is greater than or equal to one half a period p of clock signal ECLK, and is also less than or equal to the period p. Accordingly, FIG. 5 illustrates a case in which the following equation 4 is true:

$$p/2 \leq (delay2-delay1) \leq p \quad \text{(equation 4)}$$

In this case, the clock setup time slack S_setup can be calculated using the following equation 5, where n=1 if clock signal ECLK clocks data on only one clock edge (e.g., on rising clock edges 504 and 506), where n=2 if clock signal ECLK clocks data on rising and falling clock edges (e.g., on rising clock edges 504 and 506, and also on falling clock edge 508), and where clock signals ECLK and SCLK each exhibit 50% duty cycles:

$$S\_setup = delay2-delay1+(1/n-1)*p-ECLK2SCLK\_SET \quad \text{(equation 5)}$$

In equation 5 above, the setup time constraint ECLK2SCLK_SET will be met where clock setup time slack S_setup is greater than or equal to zero (e.g., where a time period 502 is greater than or equal to setup time constraint ECLK2SCLK_SET if n=1, and where time period 502 is greater than or equal to the sum of setup time constraint ECLK2SCLK_SET and half the period p if n=2).

Continuing the example shown in FIG. 5, the clock hold time slack S_hold can be calculated using the following equation 6, where the values of n and duty cycles of clock signals ECLK and SCLK correspond to those described in equation 5 above:

$$S\_hold = delay1+p-delay2-ECLK2SCLK\_HLD \quad \text{(equation 6)}$$

In equation 6 above, the hold time constraint ECLK2SCLK_HLD will be met for where clock hold time slack S_hold is greater than or equal to zero (e.g., where a time period 510 is greater than or equal to hold time constraint ECLK2SCLK_HLD if n=1, and where a time period 512 is greater than or equal to hold time constraint ECLK2SCLK_HLD if n=2.

Figure 6:
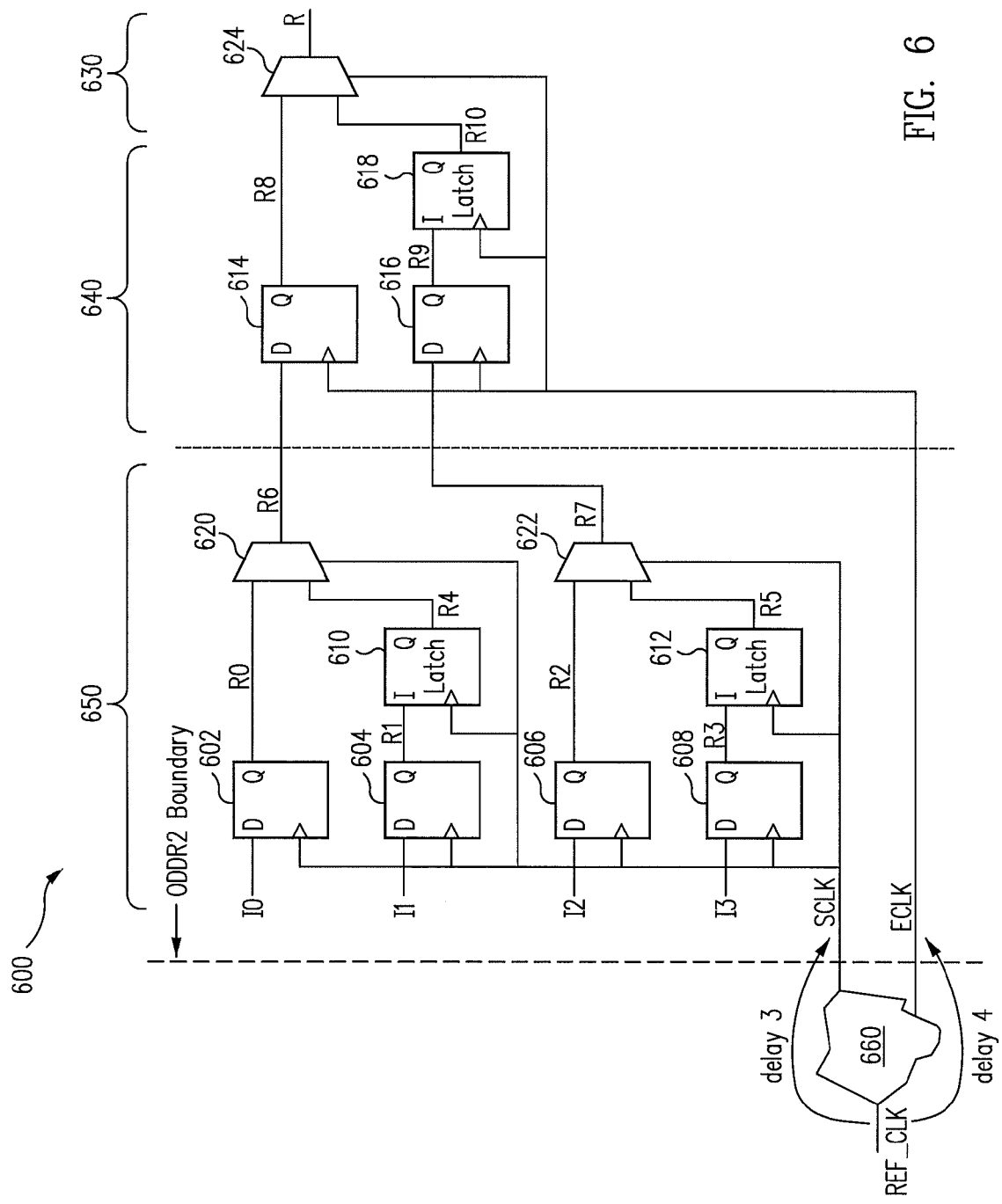
FIG. 6 illustrates an output double data rate (ODDR) block of a PLD in accordance with an embodiment of the invention.
Figure 7:
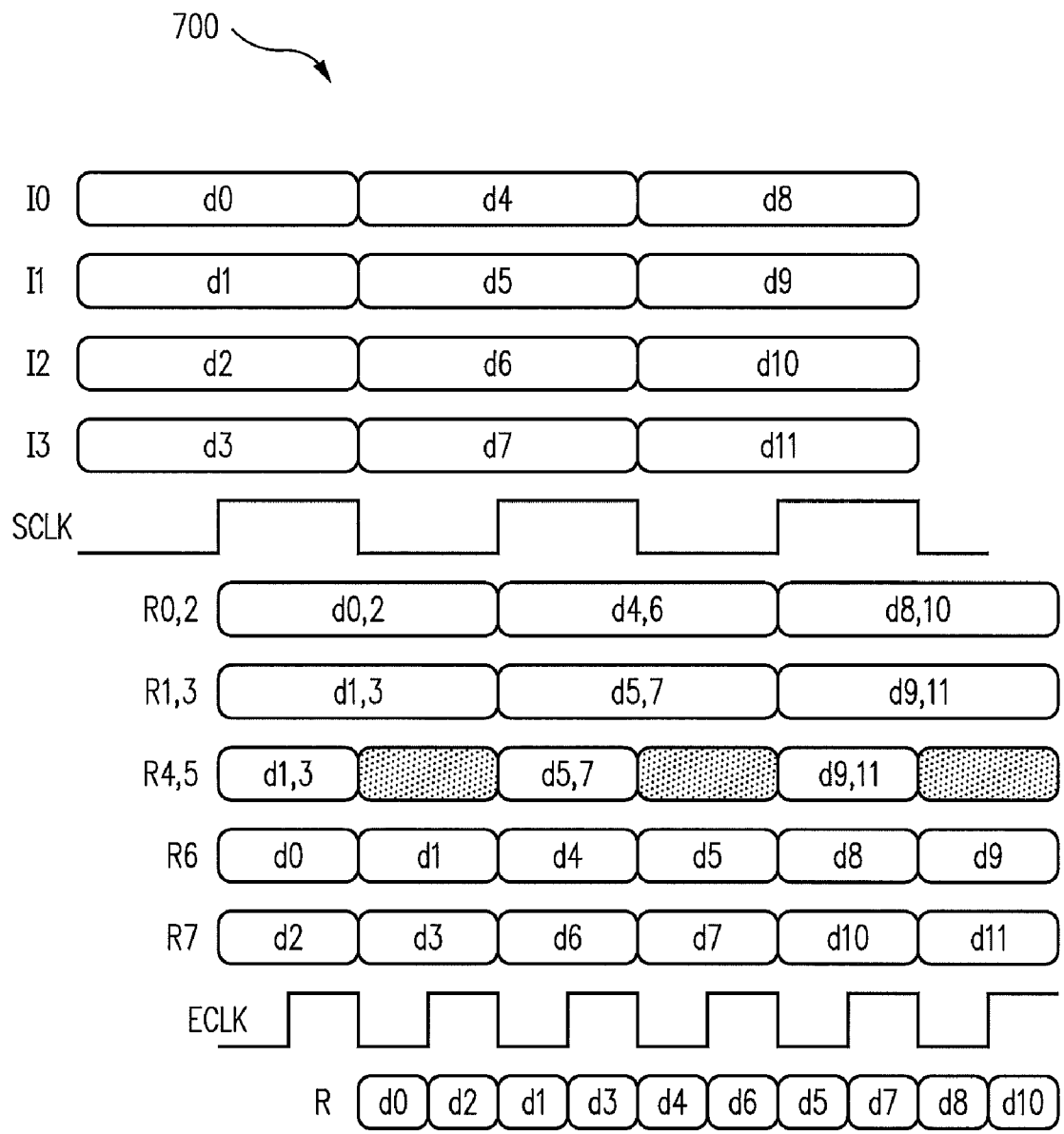
FIG. 7 illustrates a timing diagram of various signals of the ODDR block of FIG. 6 in accordance with an embodiment of the invention.

FIG. 6 illustrates an output double data rate (ODDR) block 600 of a PLD in accordance with an embodiment of the invention, and FIG. 7 illustrates a timing diagram 700 of various signals of ODDR block 600 in accordance with an embodiment of the invention. ODDR block 600 may be used to convert a plurality of parallel input data signals I0 to I3 into an output data signal R, where parallel data distributed over input data signals I0 to I3 is encoded in output data signal R. As shown in FIG. 7, input data signals I0 to I3 operate at a frequency lower than output data signal R.

In various embodiments, ODDR block 600 may be implemented as part of a DDR memory, memory 106, configuration memory 114, and/or I/O blocks 102 of PLD 100 as similarly described herein with regard to IDDR block 200.

As shown in FIG. 6, ODDR block 600 includes a plurality of FFs 602 to 618 as well as a plurality of multiplexers 620 to 624. ODDR block 600 receives input data signals I0 to I3, receives clock signals ECLK and SCLK, provides intermediate data signals R0 to R10, and provides output data signal R.

Input data signals I0 to I3 are sampled by FFs 602 to 608 under the control of clock signal SCLK to provide intermediate data signals R0 to R3, respectively. Intermediate data signals R1 and R3 are sampled by FFs 610 and 612 under the control of clock signal SCLK to provide intermediate data signals R4 and R5, respectively. Multiplexers 620 and 622 provide intermediate data signals R6 and R7, respectively, which are selected from intermediate data signals R0, R2, R4, and R5 under the control of clock signal SCLK as shown in FIG. 6.

Intermediate data signals R6 and R7 are sampled by FFs 614 and 616 under the control of clock signal ECLK to provide intermediate data signals R8 and R9. FF 618 samples intermediate data signal R9 under the control of clock signal ECLK to provide intermediate data signal R10. Multiplexer 624 provides output data signal R selected from intermediate data signals R8 and R10 under the control of clock signal ECLK as shown in FIG. 6.

As previously described herein, clock signals ECLK and SCLK may operate at different frequencies. As a result, different portions of ODDR block 600 correspond to different clock domains denoted by clock domains 630, 640, and 650 in FIG. 6.

As shown in FIG. 6, in one embodiment, clock signals ECLK and SCLK may originate from reference clock signal REF_CLK which is converted and passed by intermediate circuitry 660 (e.g., one or more appropriate phase-locked loop (PLL) circuits and routing paths) to provide clock signals SCLK and ECLK to ODDR block 600. As also shown in FIG. 6, when clock signals SCLK and ECLK arrive at ODDR block 600 after passing through intermediate circuitry 660, they exhibit delays of delay3 and delay4, respectively, relative to reference clock signal REF_CLK.

Data transfers performed by ODDR block 600 have an associated setup time constraint (referred to as SCLK2ECLK_SET) and an associated hold time constraint (referred to as SCLK2ECLK_HLD) which must be met to ensure that the various data signals provided to FFs 602 to 618 are properly sampled and successfully passed across clock domains 630, 640, and 650.

For example, as shown in FIG. 7, data transfers occur, from clock domain 650 (synchronized by clock signal SCLK) to clock domain 640 (synchronized by clock signal ECLK), where clock signal ECLK lags clock signal SCLK.

Figures 8, 9:
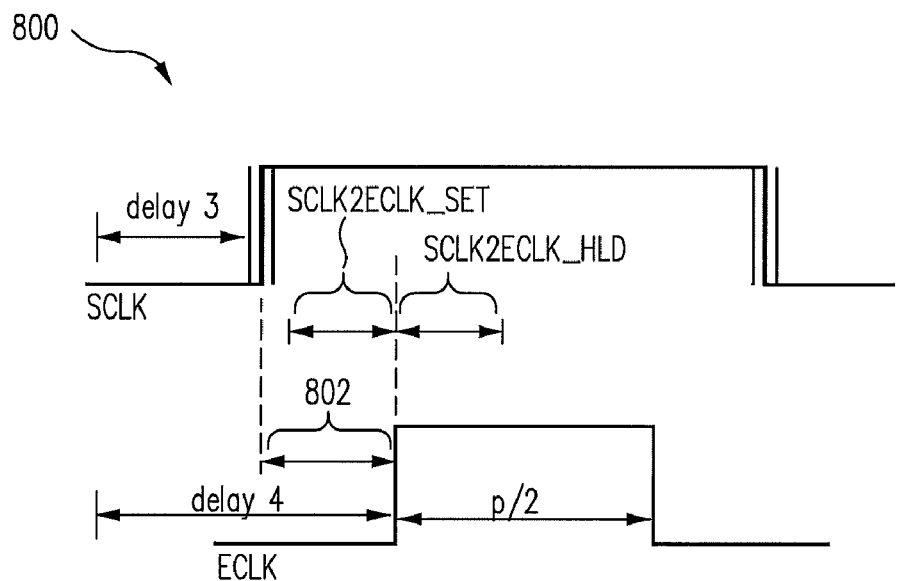
FIG. 8 illustrates a timing diagram of two clock signals of the ODDR block of FIG. 6 in accordance with an embodiment of the invention.
FIG. 9 illustrates software code to add or subtract clock periods in accordance with an embodiment of the invention.

FIG. 8 illustrates a timing diagram 800 of clock signals SCLK and ECLK of ODDR block 600 of FIG. 6 in accordance with an embodiment of the invention. In the embodiment shown in FIG. 8, the rising edge of clock signal ECLK lags behind the rising edge of clock signal SCLK by a time period 802 that is less than or equal to the period p of clock signal ECLK. Accordingly, FIG. 8 illustrates a case in which the following equation 7 is true:

$$0 \leq (delay4-delay3) \leq p \quad \text{(equation 7)}$$

In this case, where the setup time constraint associated with a data transfer from clock domain 650 to clock domain 640 (e.g., from clock signal SCLK to clock signal ECLK) is denoted SCLK2ECLK_SET, the clock setup time slack S_setup can be calculated using the following equation 8:

$$S\_setup = delay4-delay3-SCLK2ECLK\_SET \quad \text{(equation 8)}$$

In equation 8 above, the setup time constraint SCLK2ECLK_SET will be met for where clock setup time slack S_setup is greater than or equal to zero (e.g., where time period 802 is greater than or equal to setup time constraint SCLK2ECLK_SET).

Continuing the example shown in FIG. 8, where the hold time associated with a data transfer from clock domain 650 to clock domain 640 (e.g., from clock signal SCLK to clock signal ECLK) is denoted SCLK2ECLK_HLD, the clock hold time slack S_hold can be calculated using the following equation 9:

$$S\_hold = (delay3 + p) - delay4 - SCLK2ECLK\_HLD \quad \text{(equation 9)}$$

In equation 9 above, the hold time constraint ECLK2SCLK_HLD will be met for where clock hold time slack S_hold is greater than or equal to zero.

In view of the above discussion, it will be appreciated that clock setup time slacks S_setup and clock hold time slacks S_hold can be calculated for the transfer of data between clock domains synchronized by clock signals ECLK and SCLK for single edge and double edge clocking schemes, as well as for different ranges of lag times between clock signals ECLK and SCLK.

In the above discussion, it is assumed that delay2≧delay1, delay4≧delay3, |delay2−delay1|≦p, and |delay4−delay3|≦p. However, if surplus clock periods are included in any of delay1, delay2, delay3, and/or delay4, such surplus clock periods can be removed in order to meet such assumptions.

In particular, surplus clock periods of clock signal ECLK may be removed from clock setup time slack S_setup or clock hold time slack S_hold in order to bring such slack values into the ranges identified in the following equations 10 and 11:

$$S\_setup \subseteq [-setup\_time, p/n - setup\_time] \quad \text{(equation 10)}$$

$$S\_hold \subseteq [-hold\_time, p/n - hold\_time] \quad \text{(equation 11)}$$

In equation 10, setup_time is a value of setup time constraint ECLK2SCLK_SET where data is transferred from a clock domain synchronized by clock signal ECLK to a clock domain synchronized by clock signal SCLK, or SCLK2ECLK_SET where data is transferred from a clock domain synchronized by clock signal SCLK to a clock domain synchronized by clock signal ECLK.

In equation 11, hold_time is a value of hold time constraint ECLK2SCLK_HLD where data is transferred from a clock domain synchronized by clock signal ECLK to a clock domain synchronized by clock signal SCLK, or SCLK2ECLK_HLD where data is transferred from a clock domain synchronized by clock signal SCLK to a clock domain synchronized by clock signal ECLK.

FIG. 9 illustrates software code 900 to add or subtract clock periods in accordance with an embodiment of the invention. For example, in one embodiment, software code 900 may be executed by processor 124 of system 120.

As shown in FIG. 9, software code 900 identifies a process identified as "ddr_adjust_setup_slack" which receives three long integer parameters identified as "slack," "adj_size," and "setup_time." The parameter "slack" references a value of clock setup time slack S_setup calculated in accordance with equations 2, 5, or 8 described herein. The parameter "adj_size" is the time value of a whole clock period (e.g., p) of clock signal ECLK if ECLK is implemented as a single-edge trigger clock, or the time value of a half clock period (e.g., p/2) of clock signal ECLK if ECLK is implemented as a double-edge trigger clock. The parameter "setup_time" is a value of a setup time constraint as previously described.

In line 910, software code 900 defines an original slack value "slack_org" as equal to the original value of the parameter "slack." In lines 920, software code 900 recursively increments the parameter "slack" by the parameter "adj_size" until the parameter "slack" is greater than or equal to the lower bound of the range identified in equation 10.

In line 930, software code 900 defines a threshold value "thresh" as the difference between the parameter "adj_size" and the parameter "setup_time." In lines 940, if the threshold value "thresh" is greater than zero, then software code 900 recursively decrements the parameter "slack" by the parameter "adj_size" until the parameter "slack" is less than or equal to the upper bound of the range identified in equation 10.

In line 950, software code 900 returns the difference between the parameter "slack" and the original slack value "slack_org." This returned difference corresponds to an adjusted value of clock setup time slack S_setup that falls within the range identified in equation 10 with surplus clock periods of clock signal ECLK removed.

Software code 900 may be modified to provide an adjusted value of clock hold time slack S_hold that falls within the range identified in equation 11 (rather than equation 10) with surplus clock periods of clock signal ECLK removed. In this regard, parameter "slack" may be replaced with a value of clock hold time slack S_hold calculated in accordance with equations 3, 6, or 9, described herein. In addition, parameter "setup_time" may be replaced with a parameter "hold_time" which is a value of a hold time constraint as previously described.

Figure 10:
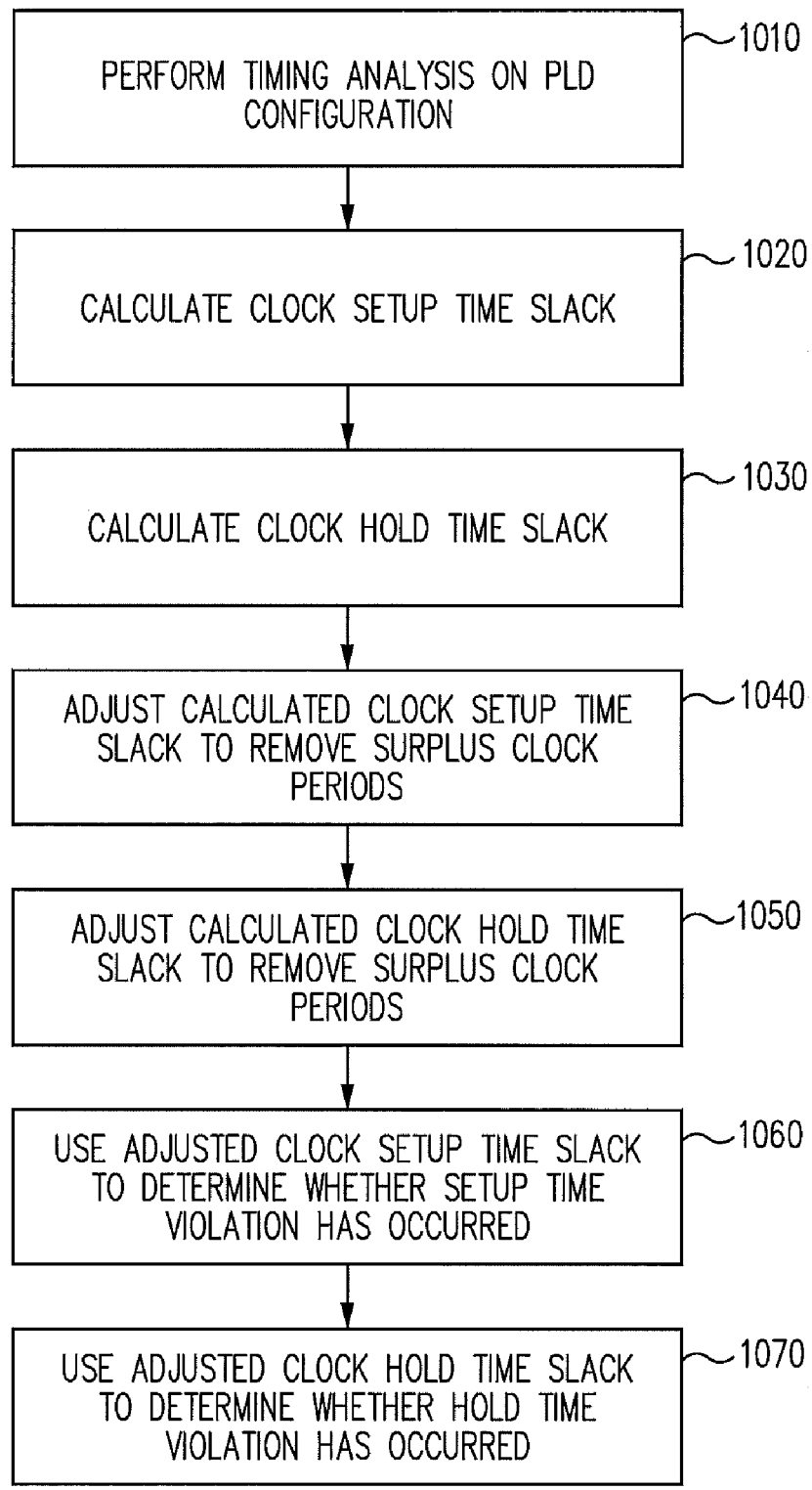
FIG. 10 illustrates a flowchart of a process for identifying setup time and hold time violations associated with clock signals of a PLD in accordance with an embodiment of the invention.

The various techniques described herein may be applied to identify setup time and hold time violations associated with data transfers between different clock domains synchronized by clock signals ECLK and SCLK. In this regard, FIG. 10 illustrates a flowchart of a process for identifying such setup time and hold time violations in accordance with an embodiment of the invention. In one embodiment, the process of FIG. 10 may be performed by processor 124 of system 120.

In step 1010, system 120 performs a timing analysis on a proposed configuration of PLD 100. For example, this may include a timing analysis of the various clock signals and other components shown in IDDR block 200 of FIG. 2 and/or ODDR block 600 of FIG. 6. As a result, values of ECLK2SCLK_SET, ECLK2SCLK_HLD, SCLK2ECLK_SET, SCLK2ECLK_HLD, delay1, delay2, delay3, delay4, period p, and/or other associated values of the configuration may be determined.

In one embodiment, during the timing analysis of step 1010, setup time can be determined by using the worst case delay for data signal paths, and using the best case delay for clock signal paths. Also in this embodiment, hold time can be determined by using the best case delay for data signal paths, and using the worst case delay for clock signal paths. Also in this embodiment, where portions of clock signal paths are shared by more than one clock signal (e.g., clock signals ECLK and SCLK may share at least a portion of a clock signal path of clock signal REF_CLK), the timing analysis of step 1010 may associate such shared portions with a shared delay value.

In step 1020, system 120 calculates clock setup time slack S_setup in accordance with equations 2, 5, or 8 described herein. In step 1030, system 120 calculates clock hold time slack S_hold in accordance with equations 3, 6, or 9 described herein.

In step 1040, system 120 calculates an adjusted value of clock setup time slack S_setup that falls within the range identified in equation 10 as described herein with regard to software code 900. In step 1050, system 120 calculates an adjusted value of clock hold time slack S_hold that falls within the range identified in equation 11 as described herein with regard to the modified version of software code 900.

In step 1060, system 120 determines whether a setup time violation has occurred. In this regard, if the adjusted value of clock setup time slack S_setup determined in step 1040 is greater than or equal to zero, then system 120 determines that no setup time violation has occurred. However, if the adjusted value of clock setup time slack S_setup determined in step 1040 is less than zero, then system 120 determines that a setup time violation has occurred, and data transfers between different clock domains synchronized by clock signals ECLK and SCLK will violate their setup time constraints.

In step 1070, system 120 determines whether a hold time violation has occurred. In this regard, if the adjusted value of clock hold time slack S_hold determined in step 1050 is greater than or equal to zero, then system 120 determines that no hold time violation has occurred. However, if the adjusted value of clock hold time slack S_hold determined in step 1050 is less than zero, then system 120 determines that a hold time violation has occurred, and data transfers between different clock domains synchronized by clock signals ECLK and SCLK will violate their hold time constraints.

If setup time or hold time violations are found in steps 1060 or 1070, the routing, clock frequencies, clock delays, and/or other parameters of the PLD configuration may be revised by developers and/or system 120 to attempt to remove such violations. The process of FIG. 10 can then be repeated as may be desired to further check whether such violations are removed from the revised PLD configuration.

In view of the present disclosure, it will be appreciated that various approaches to detecting setup time and hold time violations in PLDs as set forth herein can be used in the design of PLD configurations. Advantageously, such approaches can be used in place of conventional zero clock skew techniques in order to support data transfers between multiple clock domains within such PLD configurations. In addition, although such techniques have been described in relation to particular clock signals exhibiting 50% duty cycles in DDR2 applications, it will be appreciated that such techniques can be applied to other clock signal implementations (e.g., having other duty cycles and/or other types of DDR applications) where appropriate.

Embodiments described above illustrate but do not limit the invention. It should also be understood that numerous modifications and variations are possible in accordance with the principles of the present invention. Accordingly, the scope of the invention is defined only by the following claims.

We claim:

1. A computer-implemented method of detecting timing errors in a configuration of a programmable logic device (PLD), the method comprising:
    performing a timing analysis on the PLD configuration, wherein the PLD configuration is adapted to configure the PLD to perform a data transfer between a first clock domain synchronized by a first clock signal received by a double data rate (DDR) block of the PLD configuration and a second clock domain synchronized by a second clock signal received by the DDR block, wherein the first and second clock signals originate from a reference clock signal;
    calculating a slack value associated with the data transfer using a first delay associated with the first clock signal, a second delay associated with the second clock signal, and a time constraint associated with the data transfer, wherein the first delay and the second delay are measured relative to the reference clock signal and are provided by the timing analysis; and
    determining whether the PLD configuration satisfies the time constraint based on the slack value.

2. The method of claim 1, further comprising selectively incrementing or decrementing the slack value by a period of one of the clock signals until the slack value is within a predetermined range prior to the determining.

3. The method of claim 1, wherein the time constraint is a setup time constraint, wherein the slack value is a setup time slack value.

4. The method of claim 1, wherein the time constraint is a hold time constraint, wherein the slack value is a hold time slack value.

5. The method of claim 1, wherein a frequency of the first clock signal is approximately twice a frequency of the second clock signal.

6. The method of claim 1, wherein a frequency of the second clock signal is approximately twice a frequency of the first clock signal.

7. The method of claim 1, wherein the time constraint is a setup time constraint, wherein the slack value is a setup time slack value, the method further comprising:
    calculating a hold time slack value associated with the data transfer using the first delay, the second delay, and a hold time constraint associated with the data transfer; and
    determining whether the PLD configuration satisfies the hold time constraint based on the hold time slack value.

8. The method of claim 1, wherein the PLD is configured to perform the data transfer on rising and falling edges of the first clock signal.

9. A computer readable medium on which is stored a computer program for performing the method of claim 1.

10. A system comprising:
    one or more processors; and
    one or more memories adapted to store a plurality of computer readable instructions which when executed by the one or more processors are adapted to cause the system to perform a method of detecting timing errors in a configuration of a programmable logic device (PLD), the method comprising:
    performing a timing analysis on the PLD configuration, wherein the PLD configuration is adapted to configure the PLD to perform a data transfer between a first clock domain synchronized by a first clock signal received by a double data rate (DDR) block of the PLD configuration and a second clock domain synchronized by a second clock signal received by the DDR block,
    calculating a slack value associated with the data transfer using a first delay associated with the first clock signal, a second delay associated with the second clock signal, and a time constraint associated with the data transfer, wherein the first delay and the second delay are provided by the timing analysis, and
    determining whether the PLD configuration satisfies the time constraint based on the slack value,
    wherein a frequency of one of the first and second clock signals is approximately twice the frequency of the other of the first and second clock signals.

11. The system of claim 10, wherein the method further comprises selectively incrementing or decrementing the slack value by a period of one of the clock signals until the slack value is within a predetermined range prior to the determining.

12. The system of claim 10, wherein the time constraint is a setup time constraint, wherein the slack value is a setup time slack value.

13. The system of claim 10, wherein the time constraint is a hold time constraint, wherein the slack value is a hold time slack value.

14. The system of claim 10, wherein the first and second clock signals originate from a reference clock signal, wherein the first and second delays are measured relative to the reference clock signal.

15. The system of claim 10, wherein the time constraint is a setup time constraint, wherein the slack value is a setup time slack value, wherein the method further comprises:
- calculating a hold time slack value associated with the data transfer using the first delay, the second delay, and a hold time constraint associated with the data transfer; and
- determining whether the PLD configuration satisfies the hold time constraint based on the hold time slack value.

16. The system of claim 10, wherein the PLD is configured to perform the data transfer on rising and falling edges of the first clock signal.

17. A computer-implemented method of detecting timing errors in a configuration of a programmable logic device (PLD), the method comprising:
- performing a timing analysis on the PLD configuration, wherein the PLD configuration is adapted to configure the PLD to perform a data transfer between a first clock domain synchronized by a first clock signal received by a double data rate (DDR) block of the PLD configuration and a second clock domain synchronized by a second clock signal received by the DDR block;
- calculating a slack value associated with the data transfer using a first delay associated with the first clock signal, a second delay associated with the second clock signal, and a time constraint associated with the data transfer, are provided by the timing analysis; and
- determining whether the PLD configuration satisfies the time constraint based on the slack value,
- wherein a frequency of one of the first and second clock signals is approximately twice the frequency of the other of the first and second clock signals.

18. A computer readable medium on which is stored a computer program for performing the method of claim 17.

\* \* \* \* \*

UNITED STATES PATENT AND TRADEMARK OFFICE
CERTIFICATE OF CORRECTION

| | | |
|---|---|---|
| PATENT NO. | : 7,831,856 B1 | Page 1 of 1 |
| APPLICATION NO. | : 12/061885 | |
| DATED | : November 9, 2010 | |
| INVENTOR(S) | : Liren Liu, Jianshe He and Shangzhi Sun | |

It is certified that error appears in the above-identified patent and that said Letters Patent is hereby corrected as shown below:

Col. 14, line 9: Change "are provided by the timing analysis" to --wherein the first delay and the second delay are provided by the timing analysis--.

Signed and Sealed this
Twenty-eighth Day of August, 2012

David J. Kappos
*Director of the United States Patent and Trademark Office*